INVENTOR.
JAMES R. KUBIK,

By L. E. Carnahan
AGENT.

INVENTOR.
JAMES R. KUBIK,
By L. E. Carnahan
AGENT

United States Patent Office 3,429,786

Patented Feb. 25, 1969

3,429,786

CONTROLLED ELECTROPLATING PROCESS

James R. Kubik, Upland, Calif., assignor to General Dynamics Corporation, a corporation of Delaware Filed Oct. 21, 1966, Ser. No. 588,609
U.S. Cl. 204—15 6 Claims
Int. Cl. C23b 5/64

This invention relates to circuit boards, particularly to processes and apparatus for electroplating printed circuit boards, and more particularly to a novel process and apparatus therefor for controlling the thickness of two dimensional electrodeposited metal during plating operations.

A finished or partially finished printed circuit generally consists of a flat board of insulating material such as plastic upon which are superimposed small islands of an electrically conductive material such as copper. These islands or conductive elements are generally rather small and may be very closely positioned. In addition certain of these conductive elements may require interconnection via an aperture with a similarly disposed conductive element on the opposite side of the insulating board. Thus, boards of this type are very difficult to plate. Furthermore, the techniques by which they are formed do not readily lend themselves to associated plating operations.

In view of the difficulties which arise in the formation of circuit boards, various processes and apparatus have been developed to produce a circuit board having the desired qualities. One of the primary problems with the prior art processes and apparatus is in controlling the thickness of the electrodeposited material.

This invention overcomes the thickness control problem by providing a process and apparatus for controlling the thickness of eletcrodeposited material during plating operations by utilizing a "back-to-back" technique. This inventive process and apparatus is particularly of great value where two dimensional plating has critical plating thickness requirements. A primary application, but not limited thereto, is in electronic printed circuitry where plated-through-hole or tubelet concepts are utilized and the thickness of the circuitry must be controlled in relation to the plating thickness of the interconnects.

Therefore, it is an object of this invention to provide an improved process and apparatus for electroplating techniques.

A further object of the invention is to provide a process and apparatus for controlled plating of circuit boards and the like utilizing a "back-to-back" technique.

Another object of the invention is to provide a process and apparatus for controlling the thickness of electrodeposited material during plating operations, particularly where two dimensional plating has critical plating thickness requirements.

Another object of the invention is to provide a novel plating rack arrangement wherein cathode rack movement and reorientation of the rack during the plating phase lends itself to automation by electrical, pneumatic or hydraulic sequencing.

Other objects of the invention will become readily apparent from the following description and accompanying drawings wherein.

Broadly, the invention is directed to a process and apparatus for electroplating printed circuit boards while obtaining a uniform plating thickness thereon. Also, the invention provides for two dimensional plating such as plated-through-hole or tubelet connections where circuitry thickness is to be controlled in relation to the plating thickness of the interconnect elements. More specifically, the process utilizes the arrangement of two racks supporting circuit boards adjacent one another on a cathode bar, immersion of same in an electroplating solution, application of current and system agitation for the time necessary to plate to a desired thickness, orienting the printed circuit racks (without removing from the plating solution) in a back-to-back configuration and continued plating and agitation for the time required to complete the plating process. Finally, orientation of printed circuit racks in a back-to-back configuration allows the formation of a more accurate thickness of the interconnection elements with respect to the plated thickness of the asociated printed circuitry.

Figure 1:
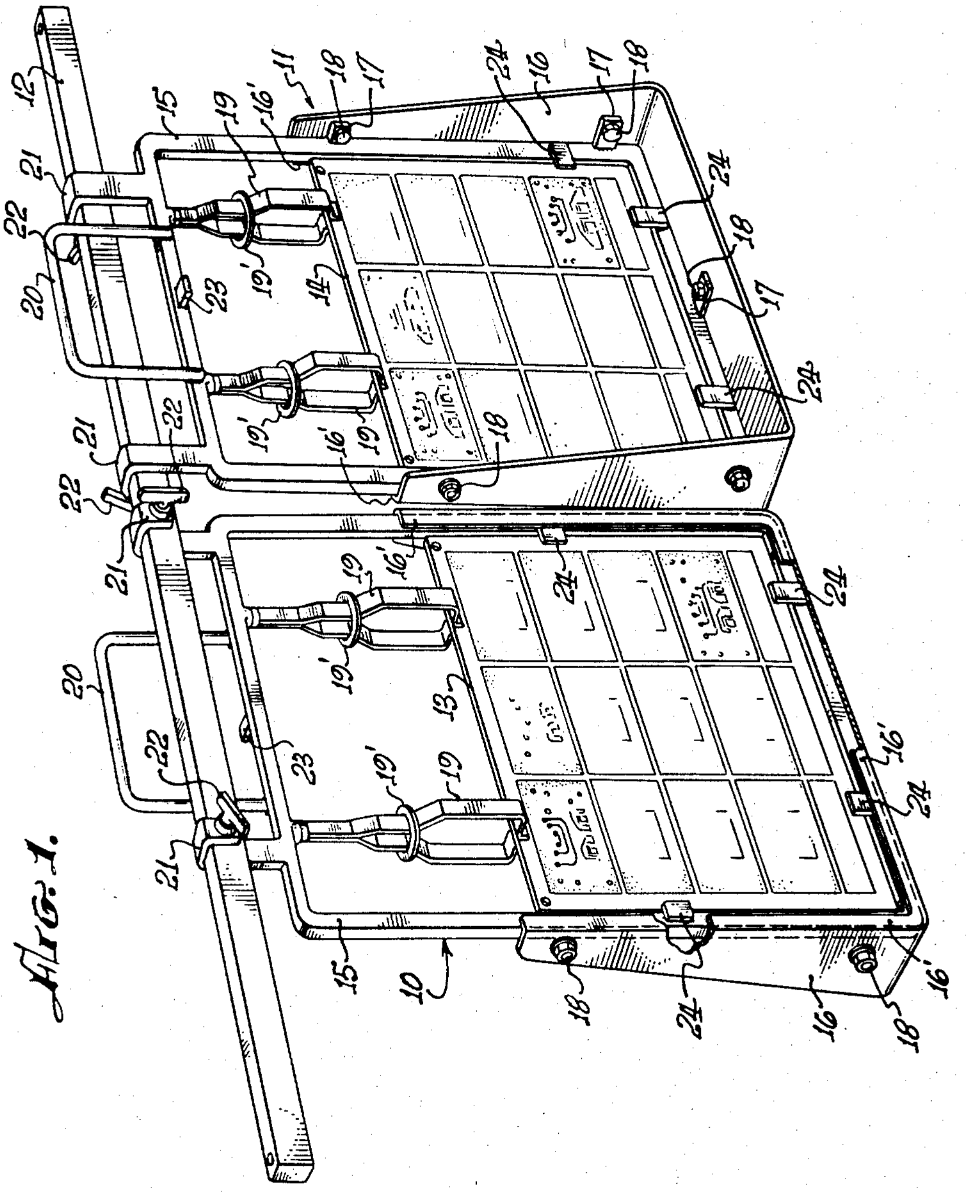
FIG. 1 is a view illustrating an embodiment of the plating apparatus of the invention with the rack members in initial placement on a cathode bar.
Figures 2, 3:
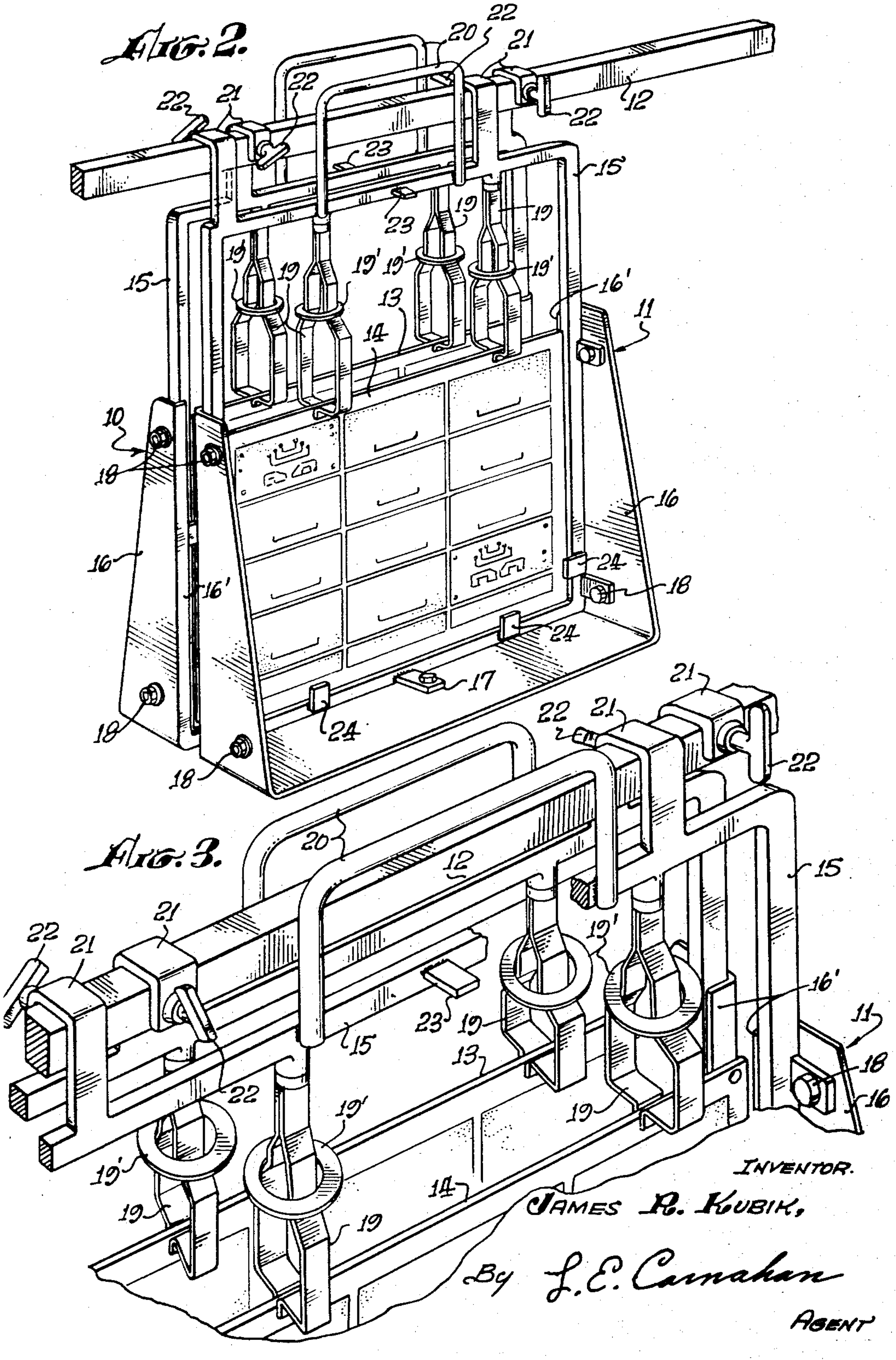
FIG. 2 is a view showing the FIG. 1 rack members oriented to the "back-to-back" position.
FIG. 3 is an enlarged view of a portion of the novel apparatus in the "back-to-back" position.

Referring now to the drawings, the inventive apparatus comprises a pair of rack members 10 and 11 operatively positioned on a cathode bar 12, each of racks 10 and 11 holding circuit board panels 13 and 14, respectively for electroplating procedures described hereinafter. The panels 13 and 14 are each provided with an actual circuit side and a redundant circuit side which in the construction of circuit boards incorporating tube-like members, for example, is removed after the plating process is completed. As shown in FIG. 1, the side of panel 13 being illustrated is the actual circuit side while the side of panel 14 being illustrated is the redundant circuit. When the racks 10 and 11 are placed in the back-to-back position as shown in FIG. 2 and 3 the actual circuit sides of panels 13 and 14 face one another. The rack members 10 and 11 are constructed, for example, of welded stainless steel and are plastisol coated except for electrical contact areas. The overall size of each of the rack members illustrated herein is, for example, approximately 14 in. x 20 in. and made to accommodate one standard 9 in. x 12 in. circuit board panels 13 and 14 or two 6 in. x 9 in. circuit board panels. The thickness limitation of the circuit board panels 13 and 14 is, for example 3/16 inch.

Each of the rack members 10 and 11 is generally composed of a frame 15, a plastic or plastic coated deflection shield 16 operatively connected to flanges 17 of frame 15 by means such as plastic bolts 18, and a pair of stainless steel spring panel clamps or clips 19 having pressure adjusting ring means or washer 19, coated except for electrical contact areas, clamps 19 being removably connected to frame 15 by threaded attachment, for example. The deflection shield 16 is provided with a flange 16' and positioned adjacent the lower portions of the upright sections of frame 15 and across the bottom thereof while being located to one side of the frame as shown to aid in maintaining a uniform plate thickness on the circuit side of, for example, —½ mil or 0.005 inch. The frame 15 is provided with a handle 20 to make all pre and post treatment/rinse operations easier. Electrical cathode connection is made through a ¾ inch square stainless steel cathode bar 12 to the panel clamps 19 via a pair of hook-like members 21 which are operatively connected with frame 15 and include a bared portion which contacts cathode bar 12. The panel clamps 19 are removably secured to an associated circuit board panle 13 or 14. Hook-like members 21 are provided with thumb screws 22 or the like for securing members 21 to the cathode bar 12. Frame 15 is provided with an exposed jumper wire contact 23 for purposes described hereinafter. To hold the circuit board panel with the rack, frame 15 is additionally provided with a plurality of plastic coated tabs 24 which may be positioned on frame 15 so as to limit the thickness and restrict movement of the circuit board panel used therein.

The panel clamps 19 and hook-like members 21 are located on the frame 15 such that the "back-to-back" alignment is feasible as shown in FIGS. 2 and 3.

The controlled electroplating process provided by the invention and utilizing a "back-to-back" technique is as follows:

(1) The two plating racks 10 and 11 are loaded with prepared circuit board panels 13 and 14, respectively, which are ready for final plating.

(1.1) Orient the panels in frames 15 so that the actual printed circuit side is placed to the flat side of the rack as shown by panel 13 in FIG. 1 while the redundant circuit side faces the flanges 17 as shown by panel 14.

(1.2) Tighten spring clamps 19 by lowering locking washers 19' to assure electrical continuity with the panels.

(2) Chemically clean and rinse panel as required prior to plating.

(3) Turn plating rectifier (not shown) to a low current supply, attach cathode jumper wire (not shown) to jumper contact 23 on frame 15 of rack 10, immerse rack 10 into plating solution to about ¾ inch below the washer 19' of clamp 19, secure the rack on cathode bar 12 by positioning hook-like members 21 over bar 12 and tightening thumb screws 22, and remove the jumper wire.

(4) Repeat sequence (3) above with the second rack 11 and place next to rack 10 but from the opposite side of the cathode bar 12 as shown in FIG. 1.

(5) Increase current to produce the calculated (desired) current density.

(6) Start a cathode rack agitation system (not shown) and plate for required time (e.g. ½ hour) to obtain desired thickness on circuits and interconnects of the panels 13 and 14 which produces a first dimension plating.

(7) Attach cathode jumper wire to the contact 23 of one rack, rack 10 as shown in FIG. 2, detach rack from cathode bar 12 without removal from the plating solution and place in a "back-to-back" position as shown in FIGS. 2 and 3, and resecure rack on the cathode bar 12.

(8) Remove jumper wire and continue plating (e.g. 3 to 10 hours) until desired plating thickness is achieved on the wall of the plated-through-holes or tube-like members, or the like and the circuits on panels 13 and 14 which provides second dimension plating and restricts the first dimension plating described above.

(9) Stop cathode agitation system and remove racks 10 and 11 with plated panels 13 and 14, and turn off rectifiers.

(10) Rinse and clean panels as required.

(11) Disconnect panels 13 and 14 from racks 10 and 11 and process to finalize as needed.

During the plating operation build-up on the clamps 19 occurs and can be removed by detaching the clamps from the frame 15 and subjecting the clamps to an acid ($HNO_3$) to dissolve away the extraneous plating.

The above described procedure and apparatus produces circuit boards with interconnects therein, such as plated-through-holes or tube-like members, wherein the wall thickness of the interconnects can be plated to a controlled thickness of, for example, 0.004±0.001 inch. Conventional plating processes ordinarily result in a 3–4 to 1 ratio, yielding overplated circuitry or thin-wall interconnects. The utilization of the above described apparatus and technique with high solution movement and cathode agitation results in a controlled plating ratio of 1:1.

The above described process and apparatus is adaptable to other systems which require two dimensional controlled plating. It is not limited solely to electroplated nickel since other electro-deposited metals like copper, tin, tin/nickel, etc. could be utilized. In addition, the system of cathode rack movement and reorientation of the rack during the plating phase lends itself to automation by electrical, pneumatic or hydraulic sequencing.

While a particular embodiment of the apparatus and a particular sequence of operations have been illustrated and described, modifications will become apparent to those skilled in the art, and it is intended to cover in the appended claims all such modifications as come within the true spirit and scope of the invention.

What I claim is:

1. A controlled electroplating process for circuit boards and the like requiring two dimensional plating comprising the steps of: positioning at least one pair of plating rack members containing items to be plated in a suitable plating solution, operatively connecting the rack members to a cathode bar assembly such that the desired surface areas to be plated are facing the opposite direction, with cathode rack agitation plating the items for a required period of time to obtain desired first dimensional thickness, attaching a cathode jumper wire to one of rack members of each pair of the rack members, detaching that rack member from the cathode bar assembly without removing same from the plating solution, placing the detached rack member in a back-to-back relationship with the associated rack member of that pair such that the desired surface areas of the items being plated face one another, operatively reconnecting the detached rack member on the cathode bar assembly, removing the cathode jumper wire, continue plating the items for a required period of time to obtain desired second dimensional thickness, stopping the cathode agitation, disconnecting the rack members from the cathode bar assembly, removing the rack members from the plating solution, and rinsing and cleaning the plated items as required.

2. The process defined in claim 1, additionally including the steps of positioning an item to be plated in each of the plating rack members and operatively connecting electrical conducting elements of the rack member therewith.

3. The process defined in claim 1, additionally including the steps of chemically cleaning and rinsing the items to be plated as required prior to the step of positioning the rack members in the suitable plating solution.

4. The process defined in claim 1, additionally including the steps of applying a low electrical current to the cathode bar assembly and attaching cathode jumper wires to the plating rack members prior to the step of positioning the rack members in the suitable plating solution.

5. The process defined in claim 4, additionally including the steps of removing the cathode jumper wires after the step of connecting the plating rack members to the cathode bar assembly, and increasing the current to the cathode bar assembly to the desired current density, the plating rack members being immersed in the plating solution so as to entirely cover the item being plated.

6. The process defined in claim 1, additionally including the step of removing the plated items from the plating rack members.

References Cited

UNITED STATES PATENTS

| | | | |
|---|---|---|---|
| 2,751,340 | 6/1956 | Schaefer et al. | 204—224 |
| 3,256,586 | 6/1966 | Douglas et al. | 204—15 |
| 3,261,769 | 7/1966 | Coe et al. | 204—15 |
| 3,345,741 | 10/1967 | Reimann | 204—15 |
| 3,376,210 | 4/1968 | Kiefer et al. | 204—297 |

FOREIGN PATENTS 598,722 5/1960 Canada.

HOWARD S. WILLIAMS, *Primary Examiner.*

T. TUFARIELLO, *Assistant Examiner.*

U.S. Cl. X.R.

204—224, 297